(12) United States Patent
Tsai et al.

(10) Patent No.: US 8,734,177 B2
(45) Date of Patent: May 27, 2014

(54) ELECTRICAL CONNECTOR ASSEMBLY FOR SECURING CHIP MODULE

(71) Applicant: Lotes Co., Ltd., Keelung (TW)

(72) Inventors: Shang Ju Tsai, Keelung (TW); Jian Fei Chen, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 13/682,096

(22) Filed: Nov. 20, 2012

(65) Prior Publication Data

US 2014/0073151 A1   Mar. 13, 2014

(30) Foreign Application Priority Data

Sep. 11, 2012 (CN) ...................... 2012 2 0459937 U (51) Int. Cl.
*H01R 13/625* (2006.01)
(52) U.S. Cl.
USPC .......................................... 439/342; 439/331
(58) Field of Classification Search
USPC .............. 439/71, 73, 330, 331, 342, 525, 526
See application file for complete search history.

(56) References Cited

U.S. PATENT DOCUMENTS

| 6,821,138 | B2 * | 11/2004 | Hou ............................... 439/342 |
| 7,815,457 | B2 * | 10/2010 | Zhang et al. ................... 439/342 |
| 7,841,868 | B2 * | 11/2010 | Tang et al. ....................... 439/71 |
| 8,147,266 | B2 * | 4/2012 | Ho ................................. 439/331 |
| 8,337,231 | B2 * | 12/2012 | Hsu et al. ....................... 439/342 |
| 8,425,245 | B2 * | 4/2013 | Tsai et al. ...................... 439/331 |

\* cited by examiner

*Primary Examiner* — Thanh Tam Le
(74) *Attorney, Agent, or Firm* — Morris Manning & Martin LLP; Tim Tingkang Xia, Esq.

(57) ABSTRACT

An electrical connector for electrically connecting a chip module to a printed circuit board. The electrical connector includes an insulating body and a pressing plate for covering the insulating body. A receiving area for receiving the chip module is disposed on the insulating body. Multiple terminal receiving slots are provided inside the receiving area, and at least one bump is disposed inside the receiving area. An opening is provided at the pressing plate. An urging portion is disposed at each of two opposite sides of the opening, respectively, and pressing force-application points are formed at two ends of the urging portion. When the pressing plate covers the insulating body, the bump is correspondingly located below the force-application points to bear the chip module, so as to avoid warps and deformations of the chip module when pressed.

8 Claims, 6 Drawing Sheets

ELECTRICAL CONNECTOR ASSEMBLY FOR SECURING CHIP MODULE

CROSS-REFERENCE TO RELATED APPLICATIONS

This application claims priority to and the benefit of, pursuant to 35, U.S.C. §119(a), Patent Application No. 201220459937.1, filed in P.R. China on Sep. 11, 2012,, the disclosure of which is incorporated herein in its entirety by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to an electrical connector, and more particularly to an electrical connector for electrically connecting a chip module to a printed circuit board.

BACKGROUND OF THE INVENTION

Currently, an electrical connector is usually adopted to electrically connect a chip module to a circuit board in the industry. For example, an electrical connector is disclosed in Chinese Patent CN200320117157.X, which includes an insulating body, a retaining member, a pressing plate, and a lever. A receiving area is disposed on the insulating body. Receiving slots for receiving conductive terminals are provided inside the receiving area. Each conductive terminal is provided with an elastic contact portion. The elastic contact portion extends from the receiving area. A bearing surface for supporting the chip module is disposed at the periphery of the receiving area. The retaining member is framed at the circumference of the insulating body. The pressing plate is pivotally connected to one end of the retaining member in a rotatable manner. A through hole is provided at the central position of the pressing plate. Two side edges of the through hole respectively extend downward to form two arc-shaped transitional portions. Each transitional portion is depressed downward at the center to form a pressing point. The lever is pivotally connected to the other end of the retaining member, and capable of pressing against the pressing plate on the insulating body. During use, the pressing plate is first rotated to an ON position. The chip module is installed on the insulating body, and the pressing plate is then rotated to cover the pressing plate on the insulating body. Eventually the lever is moved to make the pressing plate retained by the retaining member, so that the pressing point of the pressing plate applies a force on the chip module to make the chip module and the conductive terminals contact electrically. In the related, to further enhance the support for the chip module, support blocks are usually disposed at separation bars of the receiving slots of the conductive terminals to enhance the support for the chip module and reduce the elastic weariness of the conductive terminals.

However, with the development of technologies, a higher requirement is raised for a function capable of processing increasingly large amount of data, so that the number of contacts of the chip module increases accordingly, resulting in an enlarged area of the chip module and denser arrangement of the contacts. Therefore, the bearing area for installing the insulating body of the chip module increases accordingly and the arrangement of the terminals disposed on the insulating body also becomes denser. The structure of an existing connector has the following deficiencies:

1, When the pressing plate is retained by the retaining member, a single pressing point may easily cause the force-receiving point of the chip module to move to one end, resulting in inclination or displacement of the chip module, such that the electrical contact between the chip module and the conductive terminals becomes unstable.

2, As the area of the chip module increases, the magnitude and direction of the force applied on the chip module and the force-receiving area of the chip module are all changed. If the pressing point is simply disposed at the center of the transitional portion of the pressing plate to press against the chip module, the force applied on the chip module easily becomes uneven to cause warps and deformations, so that a part of the terminals fail to have reliable electrical contact with the chip module.

3. As the area of the insulating body increases and the arrangement of the terminal receiving slots becomes denser, it is more difficult to dispose the support block on the separation bar between the adjacent terminal receiving slots, and the space between the adjacent terminal receiving slots is already insufficient to dispose a support block capable of bearing a chip module with a larger area, While the support is only provided by the bearing surface at the periphery of the receiving area of the insulating body and the elastic contact portions of the terminals, elastic weariness or crushing deformation may easily occur to a part of the terminals, and thereby affect the electrical connection between the terminals and the chip module.

Therefore, a heretofore unaddressed need exists in the art to address the aforementioned deficiencies and inadequacies.

SUMMARY OF THE INVENTION

In one aspect, the present invention is directed to an electrical connector capable of implementing a desirable electrical connection between a chip module and a circuit board.

In one embodiment, an electrical connector for electrically connecting a chip module to a printed circuit board according to the present invention includes an insulating body and a pressing plate for covering the insulating body. A receiving area for receiving the chip module is disposed on the insulating body. Multiple terminal receiving slots are provided inside the receiving area, and at least one bump is disposed inside the receiving area. An opening is provided at the pressing plate. An urging portion is disposed at each of two opposite sides of the opening respectively, and force-application points are formed at two ends of the urging portion. When the pressing plate covers the insulating body, the bump is correspondingly located below the force-application points to bear the chip module, so as to avoid warps and deformations of the chip module when pressed.

In one embodiment, the number of the bumps is smaller than that of the terminal receiving slots.

In one embodiment, the bump is correspondingly disposed below the urging portion.

In one embodiment, a sidewall is disposed around the receiving area, where the sidewall is provided with a bearing surface.

In one embodiment, the bump is connected to the corresponding bearing surface and extends below the corresponding force-application points of the pressing plate inside the receiving area.

In one embodiment, the height of the bump is equal to that of the bearing surface.

In one embodiment, the height of the bump is lower than that of the bearing surface.

In one embodiment, the bumps are arranged in at least two rows.

In one embodiment, a retaining member is framed at the circumference of the insulating body, a driving member is pivotally connected to one end of the retaining member, and the pressing plate is pivotally connected to the other end of the retaining member.

Compared with the related art, the electrical connector of the present invention, among other things, has the following advantages:

1, The urging portion of the pressing plate is designed to extend along the length direction of the side of the pressing plate, so that two pressing force-application points are formed at two ends of each urging portion, and thereby, in the process that the driving member makes the pressing plate locked to the insulating body, the forces applied on the chip module become more even, and the phenomena of inclinations and warps may not occur.

2. The bumps are only disposed in a centralized manner below the corresponding force-application points of the urging portion in the receiving area of the insulating body, so as to enhance the supporting force of the insulating body for the chip module and reduce the force applied by the force-application points of the urging portion on the chip module to avoid warps and deformations of the chip module caused by an excessively large force applied thereto.

3. The bumps are disposed in a centralized manner at the receiving area where the terminal receiving slots are densely arranged, so as to avoid that the bumps cannot be disposed due to excessively small gaps between the adjacent terminal receiving slots as well as fabrication difficulties, and the pressure on the chip module can be shared together by the bumps and the elastic contact portions of the conductive terminals, thereby enhancing the elasticity of the conductive terminals and achieving a durable and stable electrical connection.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Figure 1:
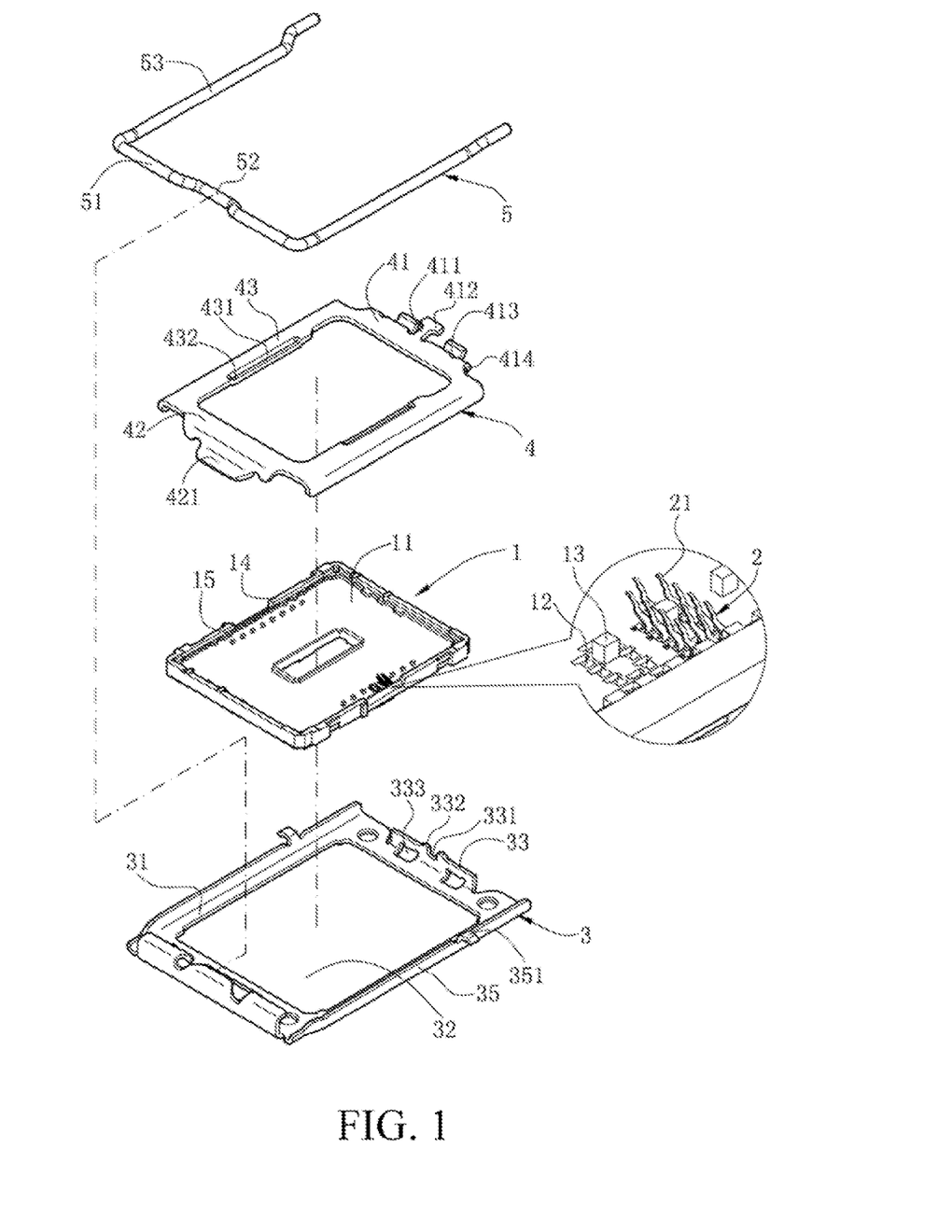
FIG. 1 is a schematic exploded view of an electrical connector according to one embodiment of the present invention.
Figure 3:
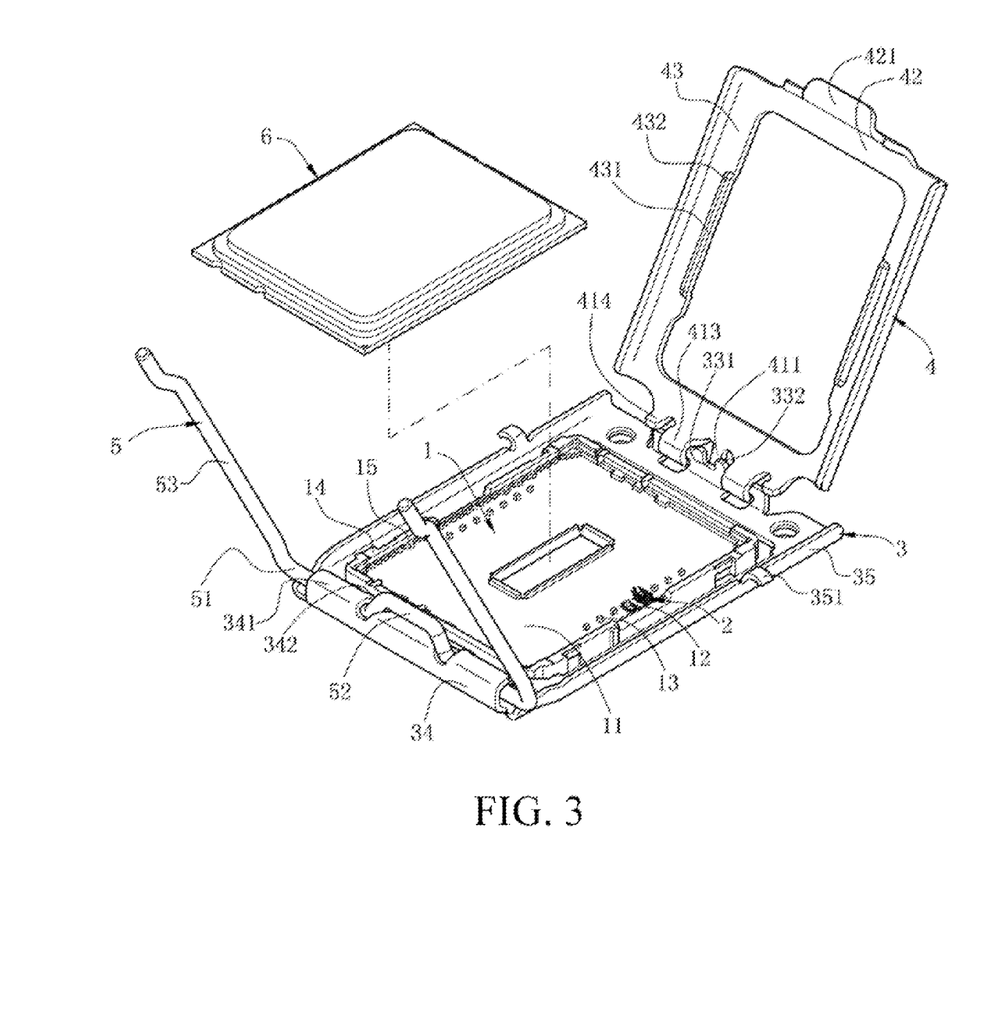
FIG. 3 is a schematic view of an open status of the electrical connector according to the embodiment of the present invention.

Referring to FIGS. 1 and 3, an electrical connector of the present invention is used for electrically connecting a chip module 6 to a circuit board (not shown). The electrical connector includes an insulating body 1, multiple conductive terminals 2 received inside the insulating body 1, a retaining member 3 framed at the circumference of the insulating body 1, a pressing plate 4 pivotally connected to one end of the retaining member 3, and a driving member 5 pivotally connected to the other end of the retaining member 3.

Figure 2:
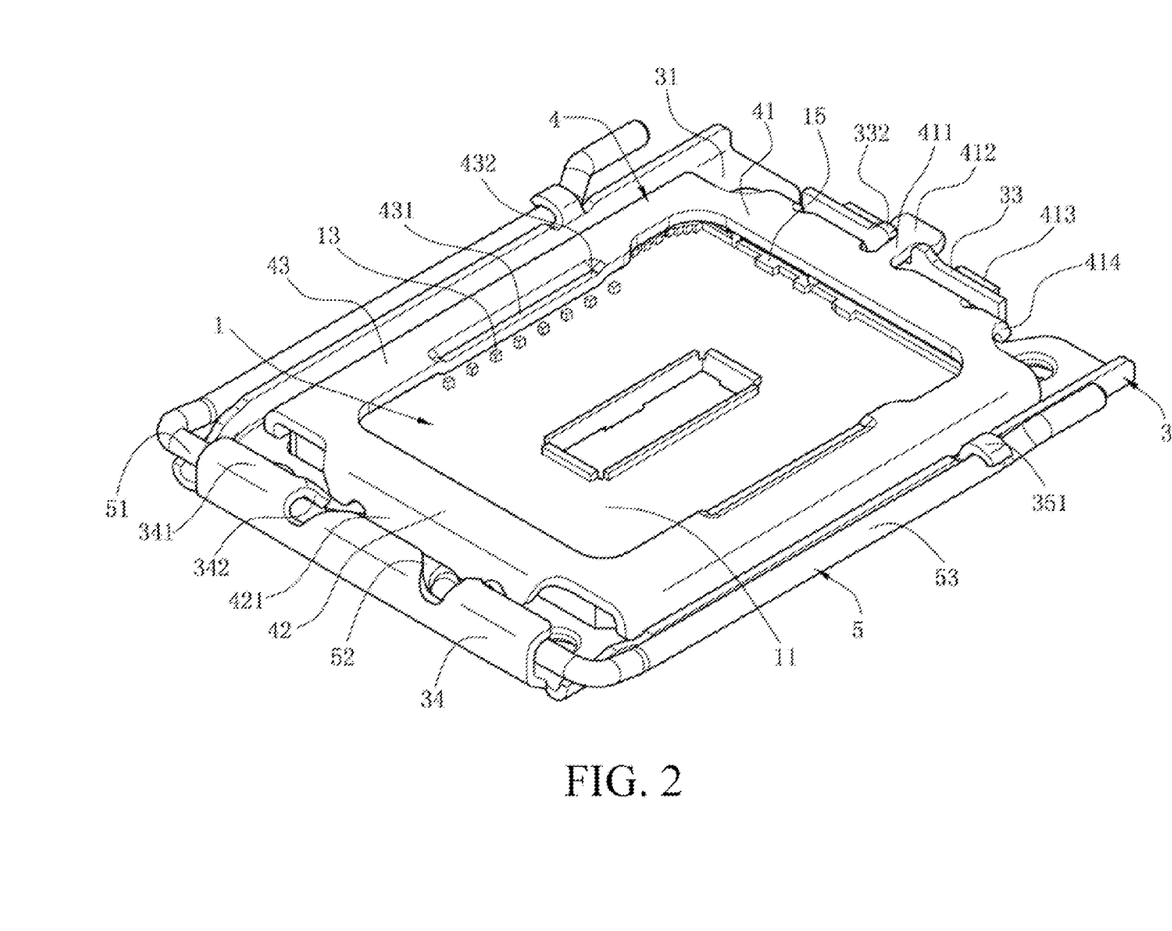
FIG. 2 is a schematic view of a closed status of the electrical connector according to the embodiment of the present invention.
Figure 6:
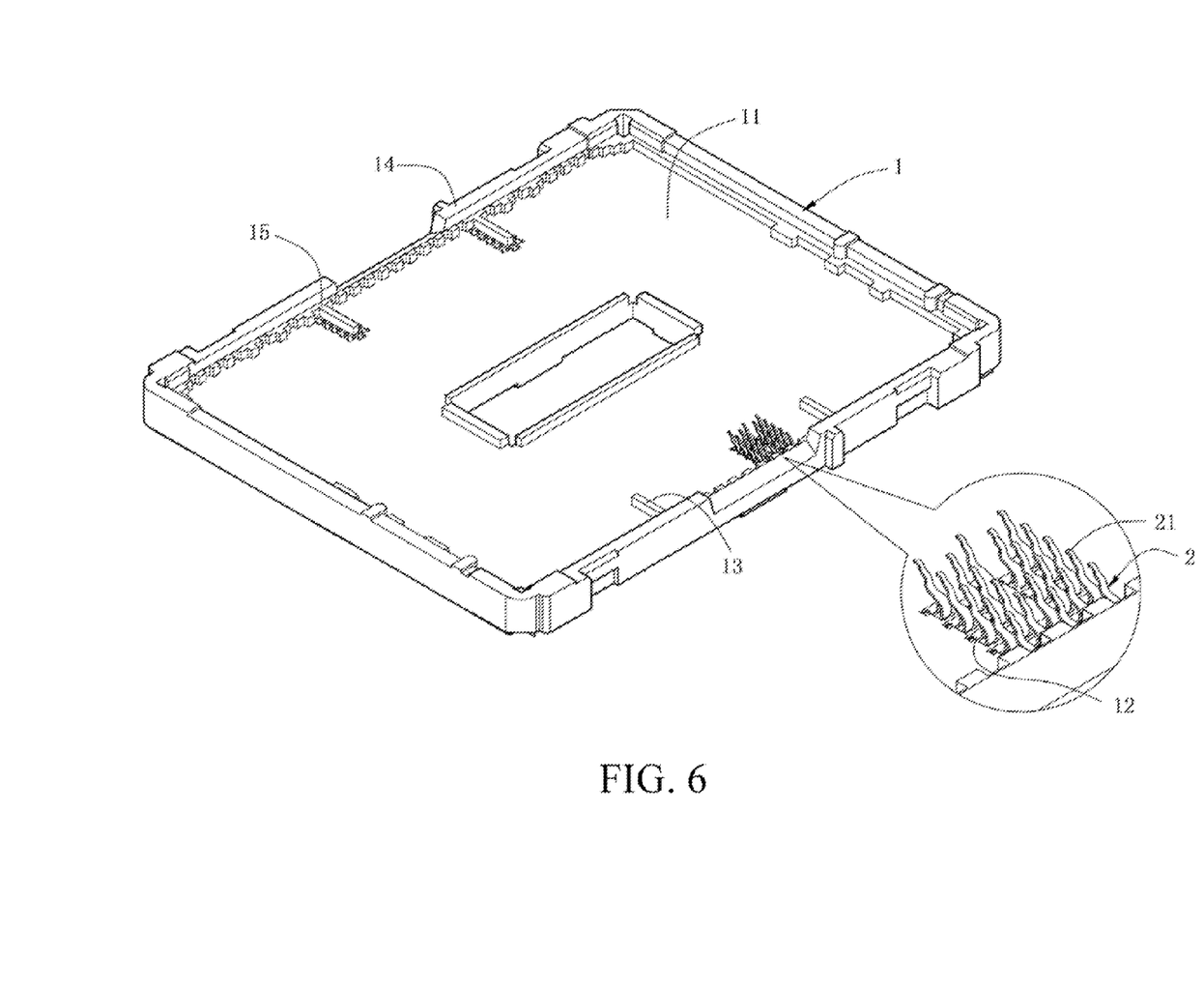
FIG. 6 is a schematic view of an insulating body of the electrical connector according to another embodiment of the present invention.

Referring to FIGS. 1-3, the insulating body 1 approximately has a rectangular plate-like structure. At the central portion of the insulating body 1, a receiving area 11 and multiple terminal receiving slots 12 penetrating the receiving area 11 are disposed, and the terminal receiving slots 12 are used for receiving the conductive terminals 2. The receiving area 11 forms a receiving space for bearing the chip module 6. The receiving area 11 is disposed with at least one bump 13. The bumps 13 are disposed between the terminal receiving slots 12 at intervals, and the number of the bumps 13 is smaller than that of the terminal receiving slots 12. In this embodiment, the bumps 13 are arranged in two rows (in other embodiments, the bumps disposed inside the receiving area are not limited to such a form, and may also be arranged in three or more rows). A sidewall 14 is disposed around the receiving area 11. The sidewall 14 extends toward the receiving area 11 to form a bearing surface 15 for bearing the chip module 6. The height of the bump 13 is equal to that of the bearing surface 15 (in other embodiments, the height of the bump may also be lower than that of the bearing surface). Referring to FIG. 6, in another embodiment, the bump 13 is connected to the corresponding bearing surface 15 and extends into the receiving area 11.

Referring to FIGS. 1 and 3, the multiple conductive terminals 2 are received inside the terminal receiving slots 12. Each conductive terminal 2 is provided with an elastic contact portion 21 for being electrically connected to the chip module 6, and the elastic contact portion 21 extends into the receiving space of the receiving area 11.

Referring to FIGS. 1-3, the retaining member 3 has a hollow frame structure and includes a base 31. An opening hole 32 is provided in the middle of the base 31. The base 31 forms two lateral sides opposite each other and two longitudinal sides connecting the two lateral sides around the opening hole 32, so as to be framed at the circumference of the insulating body 1. The two opposite lateral sides of the base 31 are disposed with a first pivoting portion 33 and a second pivoting portion 34, respectively. The first pivoting portion 33 is depressed downward at the central position on the top to form a limiting slot 331. Each of two sides of the limiting slot 331 is raised upward to form a stop portion 332, respectively. The first pivoting portion 33 is further disposed with two pivoting holes 333, which are located at the two sides of the limiting slot 331, respectively. The second pivoting portion 34 extends upward from the base 31 and then bends and extends toward the first pivoting portion 33 to form a bending portion 341. One side of the bending portion 341 extends downward to form two limiting blocks 342. The two longitudinal sides of the base 31 bend upward and extend to form an end wall 35, respectively. Each of the two end walls 35 extends outward to form a locking portion 351, respectively. The locking portions 351 are disposed on the two end walls 35 correspondingly (in other embodiments, only one locking portion may be disposed). The locking portions 351 are used for fixing the driving member 5, so that the driving member 5 is stably locked on the retaining member 3.

Referring to FIGS. 1-3, the pressing plate 4 is pivotally connected to the first pivoting portion 33 of the retaining member 3, covers the insulating body 1 for pressing against the chip module 6, and has approximately a frame structure. A hollow opening is formed on the pressing plate 4. The opening has a first side 41 and a second side 42 disposed opposite to each other, and two opposite third sides 43 connecting the first side 41 and the second side 42. The first side 41 extends outward from the central position to form a tail portion 411 which enters the limiting slot 331 of the retaining member 3, so that two sidewalls of the limiting slot 331 can stop lateral displacement of the tail portion 411. A stop block 412 extends laterally from the tail portion 411. The width of the stop block 412 is greater than that of the tail portion 411. The stop block 412 urges against the stop portion 332 of the retaining member 3 to stop longitudinal displacement of the pressing plate 4. The first side 41 bends and extends at two sides of the tail portion 411 to form two locking portions 413, which correspondingly enter the first pivoting portion 33 of the retaining member 3 and form a pivotal connection thereto, so that the pressing plate 4 can rotate about the first pivoting portion 33. One side of each locking portion 413 extends to form a stop piece 414. The stop piece 414 may urge against the first pivoting portion 33 to limit the longitudinal displacement of the pressing plate 4 together with the stop block 412. The second side 42 bends downward and extends from the central position to form a tongue 421. Each of the two opposite third sides 43 is disposed with an urging portion 431, respectively. The urging portion 431 is disposed along the length direction of an inner edge of the third side 43, and the length thereof is approximately half of that of the inner edge of the third side 43. Pressing force-application points 432 are formed at two ends of the urging portion 431. When the pressing plate 4 covers the insulating body 1, the bump 13 is correspondingly located below the force-application points 432 of the urging portion 431.

Referring to FIGS. 1 and 3, the driving member 5 is a rod-like body, which is pivotally connected to the second pivoting portion 34 of the retaining member 3 for pressing against the pressing plate 4, and is approximately "n"-shaped (in other embodiments, the driving member may also have other shapes such as an L-shape). The driving member 5 includes a pivoting rod 51 pivotally connected to the second pivoting portion 34 of the retaining member 3, so that the driving member 5 rotates about the pivoting rod 51 relative to the second pivoting portion 34. The pivoting rod 51 is raised at the central position to form a pressing portion 52 for pressing against the tongue 421 of the pressing plate 5. Two sides of the pressing portion 52 urge against the two limiting blocks 342 of the retaining member 3 to stop lateral displacement of the driving member 5. Each of two ends of the pivoting rod 51 bends and extends to form a connecting rod 53, respectively. The two connecting rods 53 are locked on the locking portions 351, so that the driving member 5 is locked at the retaining member 3.

During assembly, first, the driving member 5 is pivotally connected to the second pivoting portion 34 at one end of the retaining member 3, and the two sides of the pressing portion 52 urge against the two limiting blocks 342 of the retaining member 3. Next, the pressing plate 4 is pivotally connected to the first pivoting portion 33 at the other end of the retaining member 3, and the pressing plate 4 is in an open status. The insulating body 1 mounted with the conductive terminals 2 is assembled inside the opening hole 32 of the retaining member 3, so that the retaining member 3 is framed at the circumference of the insulating body 1. The pressing plate 4 is then closed to cover the insulating body 1. The driving member 5 is rotated to lock the two connecting rods 53 at the locking portions 351, so that the pressing portion 52 of the driving member 5 is pressed against the tongue 421 of the pressing plate 4. At this time, the bump 13 of the insulating body 1 is correspondingly located inside a region below the force-application points 432.

During the use of the electrical connector, the driving member 5 and the pressing plate 4 are opened, the chip module 6 is horizontally placed inside the receiving area 11, and the pressing plate 4 and the driving member 5 are then closed to lock the two connecting rods 53 at the locking portions 351, so that the pressing portion 52 is pressed against the tongue 421. Therefore, the urging portion 431 of the pressing plate 4 urges against the chip module 6, the force-application points 432 press against the chip module 6 as positions where the maximum force is applied. The force-application points 432, the bump 13 correspondingly located below the force-application points 432 and the bearing surface 15 together bear the chip module 6, so as to avoid excessive forces at the force-application points 432 which may cause warps and deformations at the force-receiving position of the chip module 6, thereby ensuring stable electrical contact between the chip module 6 and the conductive terminals 2.

Figure 4:
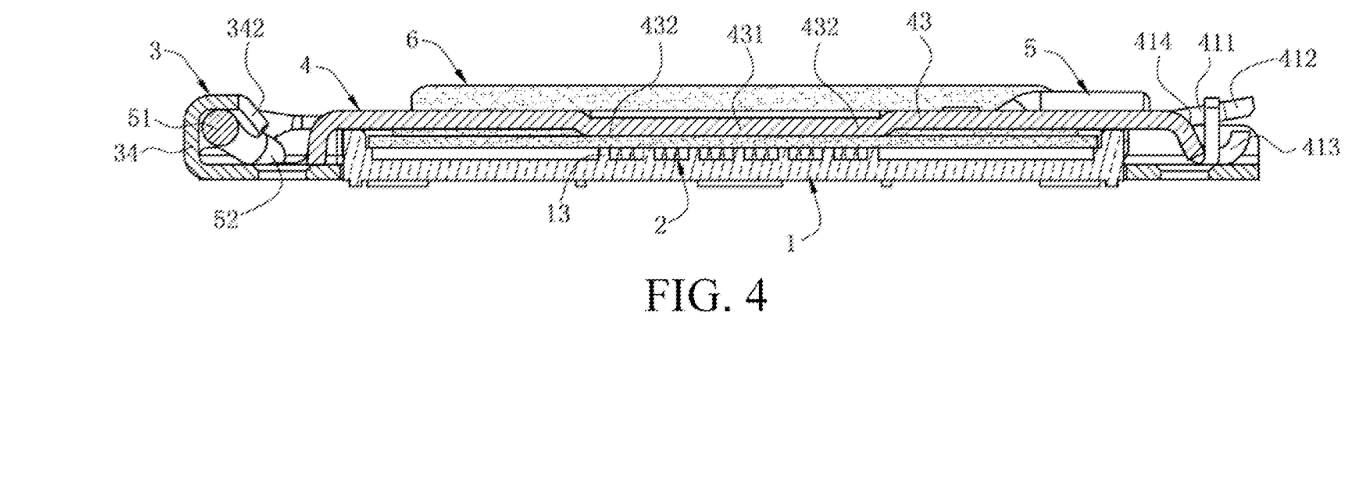
FIG. 4 is a sectional view of the closed status of the electrical connector according to the embodiment of the present invention.
Figure 5:
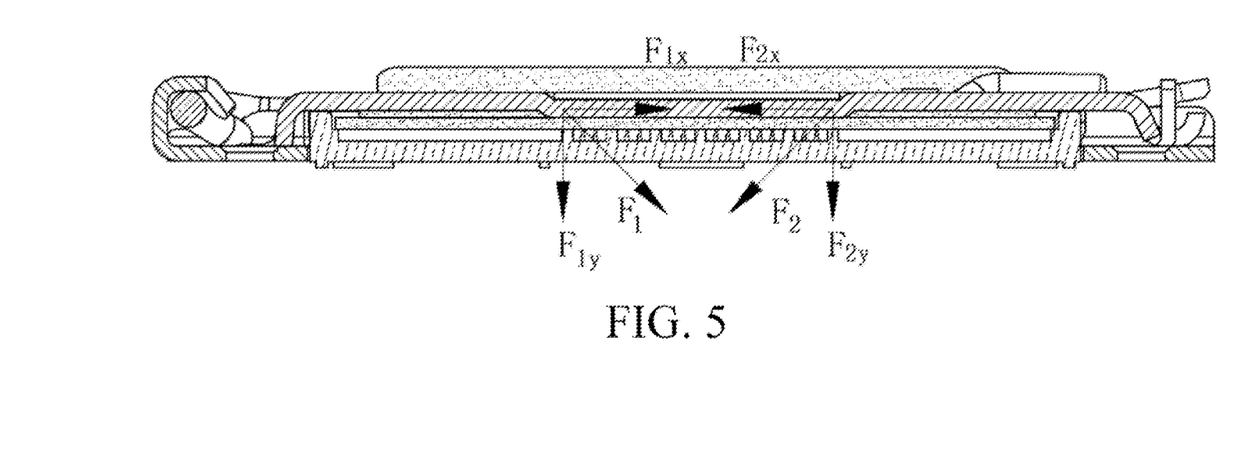
FIG. 5 is a schematic view of forces applied on a chip module when the electrical connector is in the closed status according to the embodiment of the present invention.

Referring to FIGS. 4 and 5, as the two connecting rods 53 are locked at the locking portions 351, the pressing portion 52 is pressed against the tongue 421. At this time, the first pivoting portion 33 forms a first fulcrum where the pressing plate 4 urges against the chip module 6. The force-application point 432 near the first pivoting portion 33 among the force-application points 432 at the two ends of the urging portion 431 contacts the chip module 6 first, and the pressure applied by the force-application point 432 near the first pivoting portion 33 on the chip module 6 forms an angle relative to the vertical direction. The pressure is F1, the component in the horizontal direction and the component in the vertical direction of which are $F1x$, and $F1y$, respectively. A second fulcrum is formed at the position where the pressing portion 52 is pressed against the tongue 421. The force-application point near the tongue 421 among the force-application points 432 at the two ends of the urging portion 431 contacts the chip module 6, and the pressure applied by the force-application point 432 near the tongue 421 on the chip module 6 also forms an angle relative to the vertical direction. The pressure is F2, the component in the horizontal direction and the component in the vertical direction of which are F2$x$, and F2$y$, respectively. As the chip module 6 and the conductive terminals 2 are in elastic contact through the elastic contact portions 21, when the two connecting rods 53 are locked at the locking portions 351, the force-application points 432 at the two ends of the urging portion 431 form positions where the maximum force is applied. The components F1$y$, and F2$y$, in the vertical direction press the chip module 6 downward. When the elastic contact portions 21 are pressed to a certain height, the bump 13 forms an upward support for the chip module 6. The components F1$x$, and F2$x$, in the horizontal direction are opposite to make the components of forces in the horizontal direction nearly balanced for the urging portion 431, so that the chip module 6 acquires an effective support counterforce and achieves balance.

In conclusion, the electrical connector according to the embodiment of the present invention, among other things, has the following beneficial effects:

1, The urging portion of the pressing plate is designed to extend along the length direction of the side of the pressing plate, so that two pressing force-application points are formed at two ends of each urging portion, and thereby, in the process that the driving member makes the pressing plate locked to the insulating body, the forces applied on the chip module become more even, and the phenomena of inclinations and warps may not occur.

2. The bumps are only disposed in a centralized manner below the corresponding force-application points of the urging portion in the receiving area of the insulating body, so as to enhance the bearing force of the insulating body for the chip module and reduce the force applied by the force-application points of the urging portion on the chip module to avoid warps and deformations of the chip module caused by an excessively large force applied thereto.

3. The bumps are disposed in a centralized manner at the receiving area where the terminal receiving slots are densely arranged, so as to avoid that the bumps cannot be disposed due to excessively small gaps between the adjacent terminal receiving slots as well as fabrication difficulties, and the pressure on the chip module can be shared together by the bumps and the elastic contact portions of the conductive terminals, thereby enhancing the elasticity of the conductive terminals and achieving a durable and stable electrical connection.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module to a printed circuit board, comprising:
    an insulating body, having a receiving area for receiving the chip module to be disposed thereon, multiple terminal receiving slots formed inside the receiving area, and at least one bump disposed inside the receiving area; and
    a pressing plate for covering the insulating body, having an opening, an urging portion disposed at each of two opposite sides of the opening, respectively, and force-application points formed at two ends of the urging portion to suppress the chip module,
    wherein when the pressing plate covers the insulating body, the bump is correspondingly located below the force-application points to bear the chip module, so as to avoid warps and deformations of the chip module when pressed by the urging portion.

2. The electrical connector according to claim 1, wherein the number of the bump is smaller than that of the terminal receiving slots.

3. The electrical connector according to claim 1, wherein the bump is correspondingly disposed below the urging portions.

4. The electrical connector according to claim 1,
    wherein a sidewall is disposed around the receiving area;
    wherein the sidewall is provided with a bearing surface; and
    wherein the bump is connected to the corresponding bearing surface, and extends below the corresponding force-application points of the pressing plate inside the receiving area.

5. The electrical connector according to claim 4, wherein the height of the bump is equal to that of the bearing surface.

6. The electrical connector according to claim 4, wherein the height of the bump is lower than that of the bearing surface.

7. The electrical connector according to claim 1, wherein a number of the at least one bump is at least two, and the bumps are arranged in at least two rows.

8. The electrical connector according to claim 1, wherein a retaining member is framed at the circumference of the insulating body, a driving member is pivotally connected to one end of the retaining member, and the pressing plate is pivotally connected to the other end of the retaining member.

* * * * *